US007645620B2

(12) United States Patent
Martin et al.

(10) Patent No.: US 7,645,620 B2
(45) Date of Patent: Jan. 12, 2010

(54) METHOD AND STRUCTURE FOR REDUCING PRIOR LEVEL EDGE INTERFERENCE WITH CRITICAL DIMENSION MEASUREMENT

(75) Inventors: Alexander L. Martin, Hopewell Junction, NY (US); Eric P. Solecky, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 459 days.

(21) Appl. No.: 11/163,229

(22) Filed: Oct. 11, 2005

(65) Prior Publication Data

US 2007/0082417 A1    Apr. 12, 2007

(51) Int. Cl.
    *H01L 21/66*    (2006.01)
(52) U.S. Cl. .......................................... 438/14; 257/48
(58) Field of Classification Search .................. 438/14; 257/48
    See application file for complete search history.

(56) References Cited

U.S. PATENT DOCUMENTS

| | | | |
|---|---|---|---|
| 5,917,205 | A | 6/1999 | Mitsui et al. |
| 6,396,160 | B1 | 5/2002 | Schulze et al. |
| 6,407,396 | B1 | 6/2002 | Mih et al. |
| 6,436,595 | B1 | 8/2002 | Credendino et al. |
| 6,753,947 | B2 | 6/2004 | Meisburger et al. |
| 6,766,211 | B1 | 7/2004 | Ausschnitt |
| 2003/0071997 | A1 | 4/2003 | Ausschnitt et al. |
| 2005/0104217 | A1* | 5/2005 | Narayan et al. ............. 257/769 |

OTHER PUBLICATIONS

R. B. Ananthakrishnan et al. "Narrow Kerf Overlay Test Site;" IBM Technical Disclosure Bulletin vol. 20 No. 7 Dec. 1977 pp. 2664-2666.
R. B. Ananthakrishnan et al. "Width and Overlay Test Site Design for Narrow Kerf Products;" IBM Technical Disclosure Bulletin vol. 20 No. 3 Aug. 1977 pp. 1032-1033.
G. F. Dolan et al. "Split Field Alignment Marks;" IBM Technical Disclosure Bulletin vol. 18 Mar. 1976 pp. 3306.
R. C. Hebert; "Width and Overlay Narrow Kerf Test Site;" IBM Technical Disclosure Bulletin vol. 20 No. 11A Apr. 1978 pp. 4357-4358.

* cited by examiner

*Primary Examiner*—Kiesha L. Rose
*Assistant Examiner*—Tucker Wright
(74) *Attorney, Agent, or Firm*—Cantor Colburn LLP; Wenjie Li

(57) ABSTRACT

A method for reducing edge effect interference with critical dimension (CD) measurement of semiconductor via structures includes forming a test structure in a kerf region of a semiconductor wafer, the test structure including at least a via structure and a trench structure in contact with the via structure. The via structure is formed in accordance with a critical dimension associated with a corresponding via structure in a circuit region of the semiconductor wafer, and the trench structure is formed in accordance with a widened dimension with respect to a minimum ground rule dimension associated with a corresponding trench structure in a circuit region of the semiconductor wafer.

8 Claims, 4 Drawing Sheets

METHOD AND STRUCTURE FOR REDUCING PRIOR LEVEL EDGE INTERFERENCE WITH CRITICAL DIMENSION MEASUREMENT

BACKGROUND

The present invention relates generally to semiconductor device manufacturing, and, more particularly, to a method and structure for reducing prior level edge interference with critical dimension (CD) measurement.

The fabrication of integrated circuits such as, for example, memory devices using large scale integration (LSI), very large scale integration (VLSI) or ultra large scale integration (ULSI) involves the placement of extremely complex electrical circuits on a single chip of silicon. A photolithography process is frequently used to transfer a microscopic pattern from a photomask to the silicon wafer surface of an integrated circuit. In particular, the process involves several iterations of individual reductions, wherein each individual reduction may introduce errors into the final pattern.

In order to meet the objective of increasing the density of memory cells or other logic components on a chip, semiconductor processing engineers continue to refine wafer processing methodologies. Of particular importance are the patterning techniques through which individual regions of the semiconductor structure are defined. In an effort to increase the number of components in the semiconductor structure, integrated circuit configurations have evolved into complex, three-dimensional topographies characterized by several layers of material forming patterns overlayed with respect to one another.

As device and memory cell dimensions continue to shrink, certain measurement parameters become increasingly important. For example, the requirement for overlay measurement accuracy continues to increase in order to compensate for processing inaccuracies. Since a typical photolithographic system uses a step-and-repeat and step-and-scan process to transfer the mask pattern onto the chip, each successive pattern must be properly aligned to the previously existing patterns. Otherwise, each individual pattern transformation may introduce alignment or overlay errors.

In addition to the overlay measurements, measurements of the critical dimensions (CD) of features of patterns formed within each level within a semiconductor device are also made. CD measurements are commonly implemented using different features and using different techniques from those used for measuring overlay. It is a common practice to perform separate critical dimension measurements for each pattern formed within a semiconductor device in addition to separate overlay measurements.

Presently, the in-line CD scanning electron microscope (SEM) is the "workhorse" toolset for critical dimension control and measurement. The high resolution of the device allows for the measurement and control of the lithography and etching processes during semiconductor manufacturing. CD SEMs, when operated at low voltages, typically only probe a small distance into the structure being considered. As a result, CD SEMs are good at detecting surface information. In general, measurements made by a CD SEM are not influenced by layers underneath the top upper most layer. This allows the CD SEM to provide measurements that are pertinent to current processing steps, without being subject to "noise" (i.e., interference from other features) from prior processing steps.

Unfortunately, for some types of processing steps, there are certain device features (for which the in-line CD SEM is responsible for measuring and controlling) that do not conform to this general rule. For example, when trying to measure vias after lithography and post etching in dual damascene processes, layer-to-layer interactions add significant noise to the CD measurement.

As is known in the art of dual damascene processing, a via is imaged within a trench that will eventually become the metal line to which the via connects an earlier formed metallization layer. During the via processing step, the primary concern lies with the critical dimension of the via in the resist. However, the underlying topography of the metal trench can interfere with the measurement of the via. Moreover, the variability in the size of the top layer via and the metal trench beneath the via, combined with variability in the alignment between the top layer via and the trench, may result in situations where the intended via measurement is obscured by the trench below.

Ideally, a via is printed in the middle of the trench; however, in actual practice, the via actually formed in the resist often intersects with the edge of the trench therebeneath. In this case, when the CD SEM scans to measure the via, the resulting signal that is actually processed contains information about both the via and the trench below the via. As a result, the CD SEM measurement algorithm cannot reliably distinguish between the topmost layer that is the subject of the intended measurement (i.e., the via formed in resist) and the previously formed layer therebeneath (i.e., the metal trench below). This situation leads to incorrect CD measurements which negatively affect process control and which can lead to other adverse consequences, including yield loss.

Also, for a post-etch via measurement step, the problem is somewhat similar but more intractable. The signal considered by the CD SEM contains information, not only about the intended via to be measured, but also about the trench above the via and the trench below the via. Moreover, mismeasurements at this stage of processing are even more deleterious, in that by the time the post-etch step is reached, there is no hope of reworking the wafer.

SUMMARY

The foregoing discussed drawbacks and deficiencies of the prior art are overcome or alleviated by a method for reducing edge effect interference with critical dimension (CD) measurement of semiconductor via structures. In an exemplary embodiment, the method includes forming a test structure in a kerf region of a semiconductor wafer, the test structure including at least a via structure and a trench structure in contact with the via structure. The via structure is formed in accordance with a critical dimension associated with a corresponding via structure in a circuit region of the semiconductor wafer, and the trench structure is formed in accordance with a widened dimension with respect to a minimum ground rule dimension associated with a corresponding trench structure in a circuit region of the semiconductor wafer.

in another embodiment, a test structure for reducing edge effect interference with critical dimension (CD) measurement of semiconductor via structures includes a trench structure and a via structure formed in a kerf region of a semiconductor wafer, the trench structure in contact with the via structure. The via structure is formed in accordance with a critical dimension associated with a corresponding via structure in a circuit region of the semiconductor wafer, and the trench structure is formed in accordance with a widened dimension with respect to a minimum ground rule dimension associated with a corresponding trench structure in a circuit region of the semiconductor wafer.

In still another embodiment, a test structure for reducing edge effect interference with critical dimension (CD) measurement of semiconductor via structures includes a plurality of lower trenches and a plurality of upper trenches formed in a kerf region of a semiconductor wafer. A plurality of vias is formed between the lower and upper trenches, the vias formed in accordance with a critical dimension associated with corresponding vias in a circuit region of the semiconductor wafer. The lower and upper trenches are formed in accordance with a widened dimension with respect to a minimum ground rule dimension associated with corresponding lower and upper trenches in a circuit region of the semiconductor wafer.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing prior level edge interference with critical dimension (CD) measurement. As indicated above, prior level edge interference generally stems from two contributing factors: (1) variations in the dimensions of the via and the trench structures, coupled with the relative alignment of the two structures; and (2) the via, along with the trenches above and below, are conventionally designed to be close in size to one another. For example, a 90 nm diameter via is imaged to land on a 90 nm wide trench, and vice versa. This is conventionally the case for actual chip structures, as well as kerf test structures. Whereas in the functional areas of a semiconductor wafer, the chip design is such that a via and the upper and lower trenches are printed at the minimum ground rule dimension, this need not be the case for the test structures within the kerf region.

In other words, although a trench structure is still included in the kerf region test structures (in order to properly measure the effects on the imaging of the via and represent the actual process conditions seen by the vias formed in the chip), there is no need to constrain the minimum size of each test trench constructed in the kerf region. For example, by widening the size of a lower level trench with respect to a via diameter, a subsequently formed via thereupon is unlikely to suffer from edge interference effects from the trench below (or above), even if the trench/via size is slightly deviated from the desired print size, and even if there is a degree of overlay misalignment present.

Accordingly, a ground rule methodology (for kerf test structures) is proposed herein that is based upon (for example) the overlay and linewidth specifications of the via and the trench such that the negative effects of edge interference discussed above are avoided. The particular degree to which the trench in a kerf test structure is widened in the target design may, in one embodiment, be related to the alignment specification for the via relative to both the trench above and below it. This will allow for reliable CD SEM measurements of the intended via in the kerf test structure, as the edge interference issues associated with the conventional kerf designs are avoided.

Figure 1:
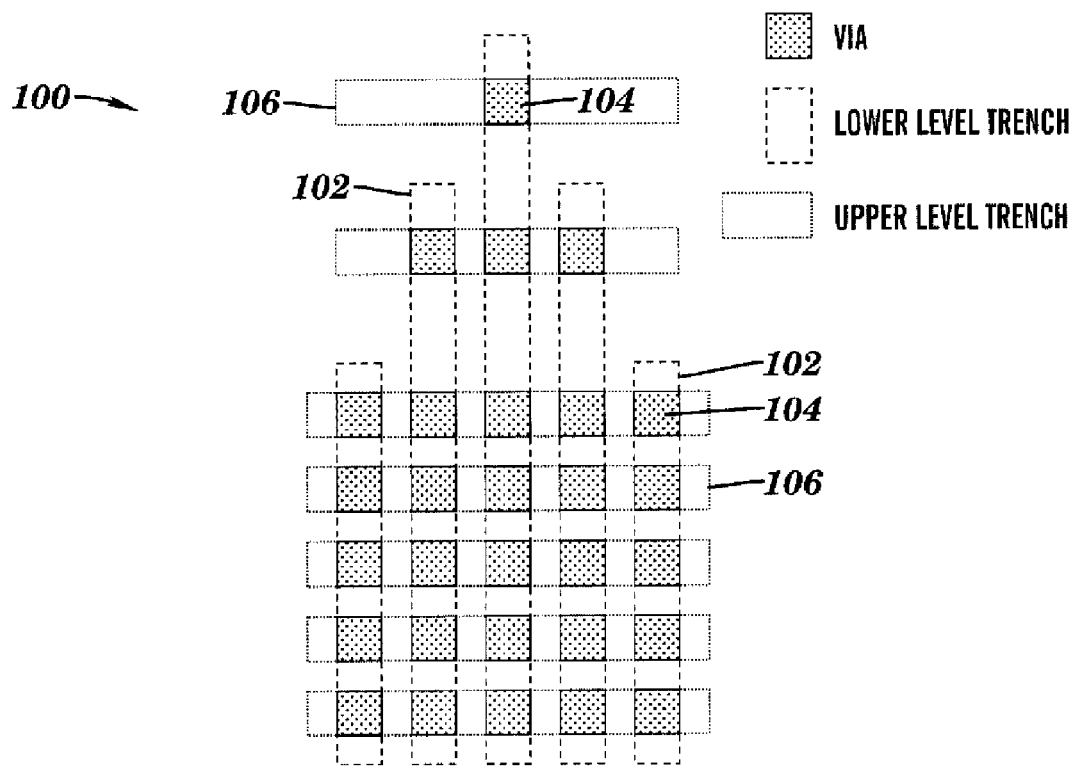
FIG. 1 is a schematic top view of a conventional wiring test structure formed in the kerf region of a semiconductor wafer.

Referring initially to FIG. 1, there is shown a schematic top view of a conventional wiring test structure 100 formed in the kerf region of a semiconductor wafer. In particular, the conventional test structure 100 includes a plurality of lower level wiring trenches 102, a plurality of vias 104 landing on the lower level trenches 102, and a plurality of upper level wiring trenches 106 above the vias 104. As will be noted, the relative dimensions of the lower level trenches 102, vias 104 and upper level trenches are configured such that they each conform to a minimum ground rule dimension and are thus substantially equivalent in width/diameter with one another. In addition, the test structure 100 is configured so as to provide vias that are relatively isolated from other vias, as well as clusters of vias in close proximity with one another, in order to mimic actual devices.

One skilled in the art will recognize that the schematic diagram of the test structure of FIG. 1 represents an "ideal" design case, in that there are no dimension variations or alignment (overlay) errors present with respect to the via/lower level trench connections or the via/upper level trench connections. In reality, however, such a situation does not exist for an actually fabricated device (either in the functional device portion of the wafer or in the test structures located in the kerf region of the wafer).

Figure 2:
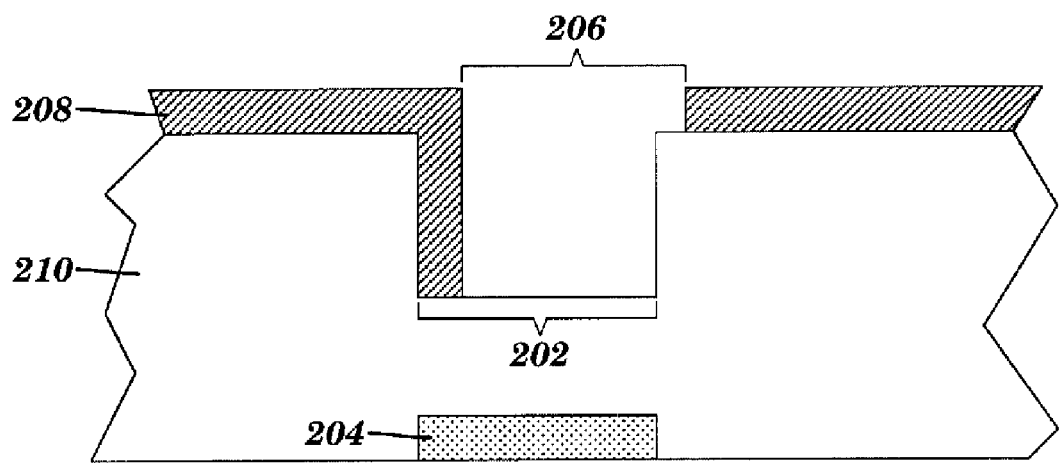
FIG. 2 is a cross-sectional view of a misaligned via patterning step in an upper level trench formed as part of a dual damascene wiring process, leading to problems in CD SEM measurements.

For example, FIG. 2 is a cross-sectional view of a misaligned via patterning step in an upper level trench formed as part of a dual damascene wiring process. Such a process step could occur, for example, in the device portion of a wafer, the kerf region or both. Although the upper wiring trench 202 is aligned with a previously formed lower wiring line following a trench patterning portion of a dual damascene process, it is seen From FIG. 2 that the via patterning portion of the process is slightly misaligned (i.e., shifted to the right in this particular example). In other words, the patterned via opening 206 formed in the photoresist material is misaligned with respect to the trench 202, resulting in some resist material remaining on the left sidewall of the trench 202, while a small portion of the top of the interlevel dielectric material 210 becomes exposed after the resist removal.

Figure 3:
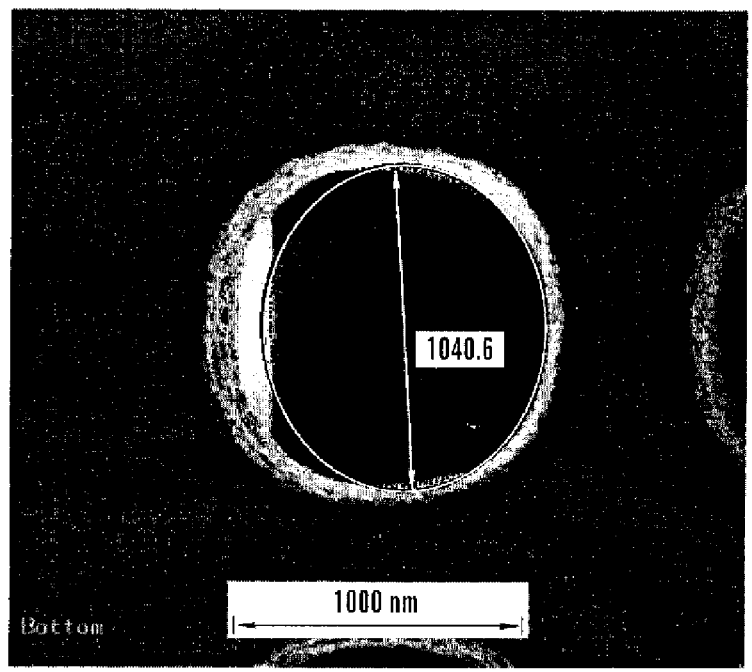
FIGS. 3 and 4 are exemplary CD SEMs of conventionally formed kerf test structures, illustrating edge interference problems leading to poor measurements.
Figure 4:
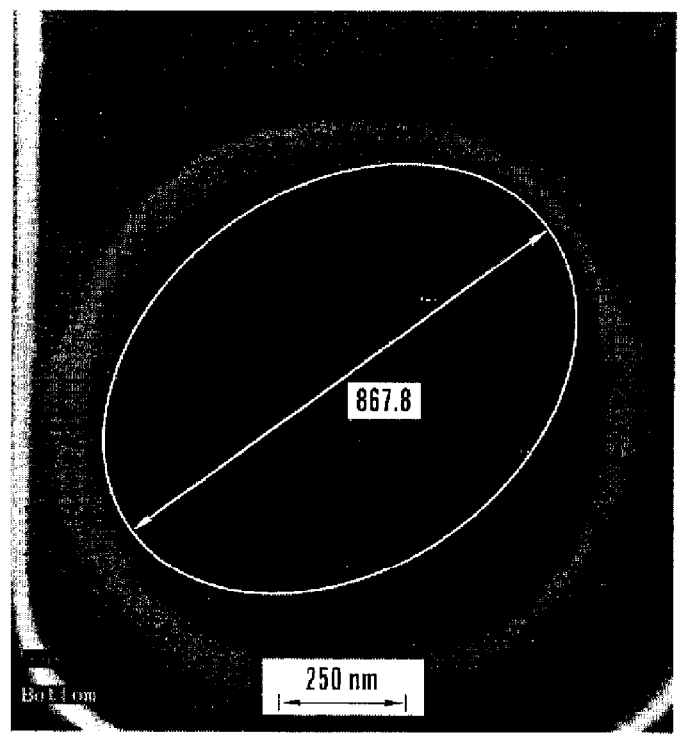

Although this type of misalignment may, as a practical matter, be within an acceptable range under the design ground rules, the presence of the same in the kerf region (where CD SEMs are taken) can present interference problems as discussed above. FIGS. 3 and 4 depict CD SEMs of via structures, taken from a kerf region of a wafer, wherein edge interference as the result of a slightly misaligned via (such as depicted in FIG. 2) results in poor measurements.

Figure 5:
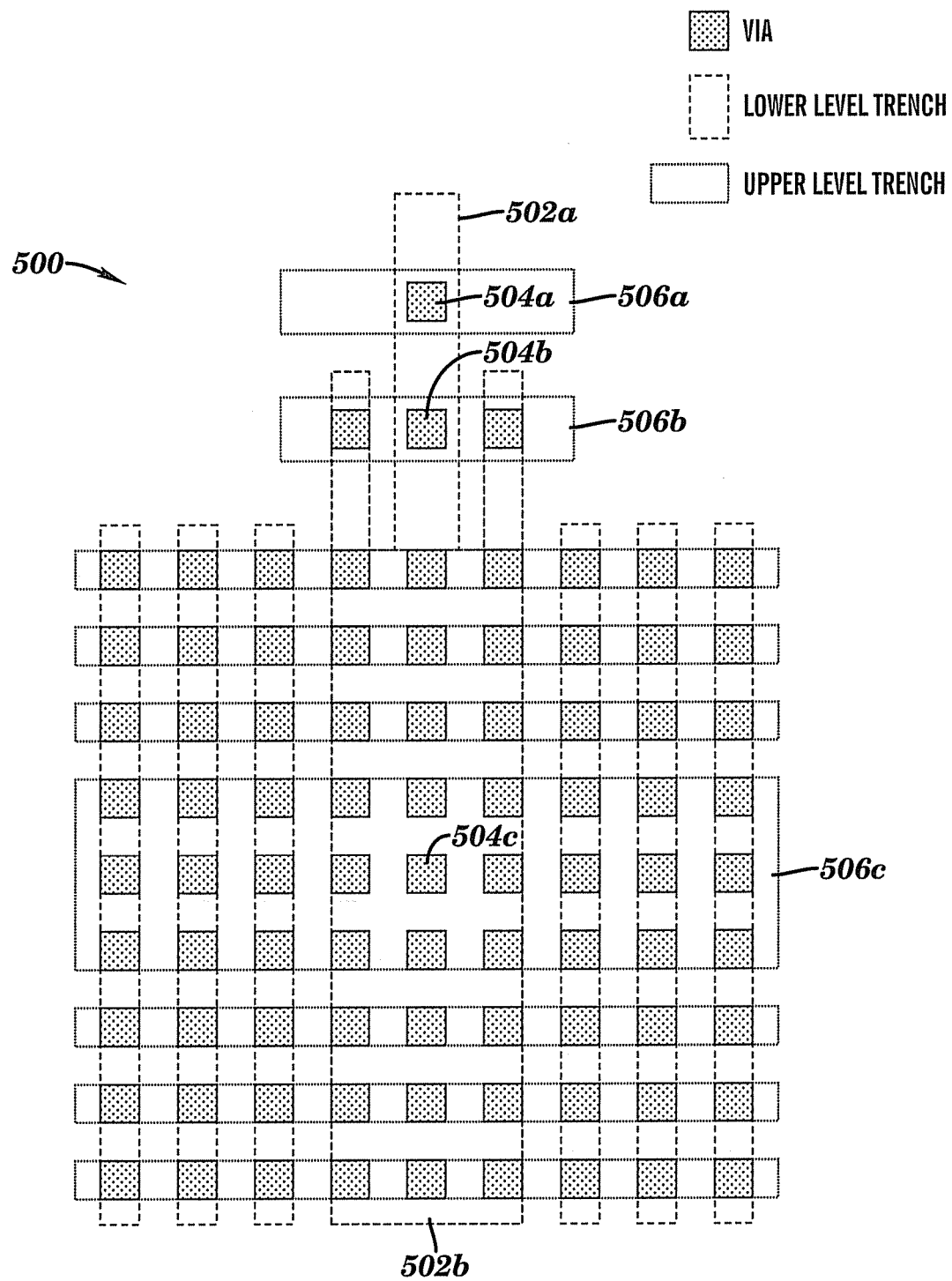
FIG. 5 is a schematic top view of a wiring test structure formed in the kerf region of a semiconductor wafer, in accordance with an embodiment of the invention.

Accordingly, FIG. 5 is a schematic top view of a wiring test structure 500 formed in the kerf region of a semiconductor wafer, in accordance with an embodiment of the invention. Instead of forming each of the kerf trench structures (and hence metal lines) to conform to the same minimum ground rule specifications as for the actual circuit devices, selected upper and lower trenches are instead widened such that certain vias within the kerf will fully land thereon, and that will be fully covered by the associated upper level trench. As such, even if the trench and via formation results in CD deviations and overlay errors, there will still be the ability to accurately measure the CD of the via, since the widened trenches in these locations will not cause edge interference problems associated with CD SEM measurement techniques.

As will be noted from the test structure 500 FIG. 5, not every trench shown therein is widened since it is still desirable to be as faithful to the original design as possible and to avoid planarazation issues associated with excessively wide trenches. Thus, for example, only lower level trenches 502*a* and 502*b* are widened with respect to the minimum ground rule dimension, while the remaining lower level trenches remain the same as for the actual device trenches. Similarly, upper level trenches 506*a*, 506*b* and 506*c* are selectively widened with respect to the minimum ground rule dimension, while the width the remaining upper level trenches are faithful to the original design specifications. As a result of this trench widening, it will be seen that certain vias (namely 504*a*, 504*b* and 504*c*) are now particularly suitable for interference-free CD SEM measurement.

In order to measure vias formed in various types of location environments (e.g., "isolated" vias such as via 504*a* or "nested" vias such as via 504*c*), it may be desirable to vary the degree of widening of certain trenches within the kerf test structure. For example, for accurate CD measurement of via 504*a*, the degree to which trenches 502*a* and 506*a* are widened is less than that of trenches 502*b* and 506*c*. Again, trenches 502*b* and 506*c* are widened by a greater degree in order to allow a subcluster of vias to be formed therebetween, and so that the middle via 504*c* in that subcluster may be accurately measured in its nested location.

Figure 6:
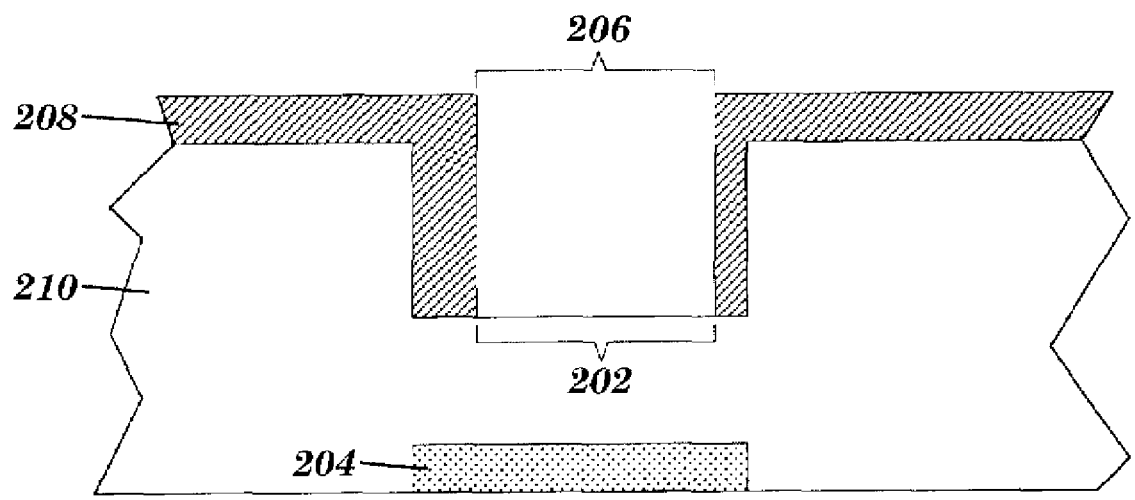
FIG. 6 is a cross-sectional view of a via patterning step in an upper level trench formed as part of a dual damascene wiring process, using a kerf ground rule design approach in accordance with an embodiment of the invention.
Figure 7:
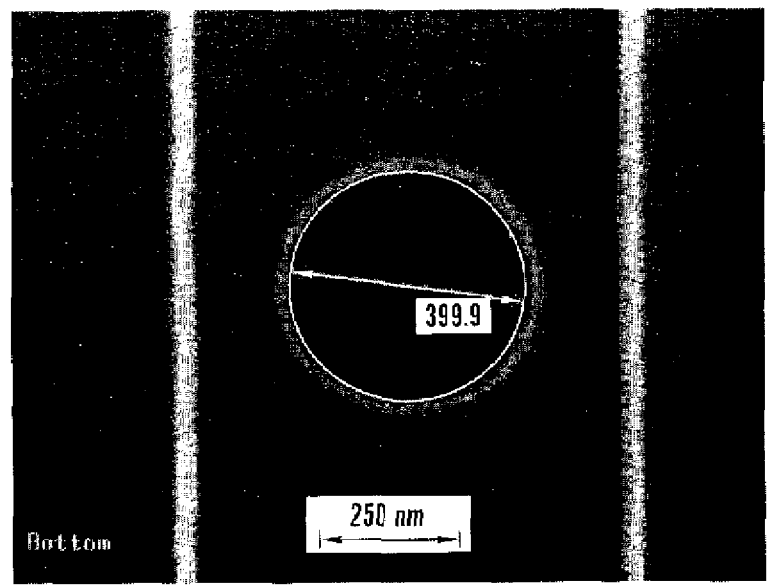
FIG. 7 is an exemplary CD SEM of a kerf test structure formed in accordance with an embodiment of the invention, illustrating the elimination of prior edge effects.

Returning once again to the exemplary dual damascene wiring process of FIG. 2, by widening the trench structures in the test structure that correspond to vias to be measured, even a sizing error or overlay error will not prevent an accurate CD SEM measurement of the via. As shown in FIG. 6, the same alignment error with the patterned via opening 206 formed in the resist material 208 does not result in edge interference with the measurement since the via will still fully land on the widened lower line 204 after the via etch step. Moreover, the widened upper trench 202, when filled, will not overlap with the via. By way of further illustration, FIG. 7 is an exemplary CD SEM of a kerf test structure, formed in accordance with an embodiment of the invention, illustrating the elimination of prior edge effects. As is shown in FIG. 7, there are no edge effects that obscure the via boundaries, as the upper trench is visibly wider than the diameter of the via opening.

The degree to which a trench on a given metallization level, x, is selectively widened may, in an exemplary embodiment, be made to depend directly from the overlay specification from the previous level. For instance, the trench width for a given trench in a test structure may be printed in accordance with the following rule:

$Mx$ trench width=$Mx$ minimum spacing+$N*Mx$ to prior level overlay specification In other words, the extent to which the trench width (for a given metallization level) is widened beyond the minimum spacing width is a factor of the overlay tolerance of the prior device level. This factor, N, is preferably at least about 2 (in an exemplary embodiment), since the trench should be wide enough to compensate for any anticipated deviations in printed feature size and location. Thus, for example, if the minimum spacing for a given circuit level is 500 nm, and the overlay specification for the previous level is 50 nm, then (using an exemplary factor of 4) the resulting kerf structure trench width (either upper or lower) with respect to a via to be measured becomes 500 nm+(4*50 nm)=700 nm.

It should be appreciated that the above equation used in accordance with the present design rule methodology can be varied so as to be based on critical dimension tolerances instead of overlay specification, or based on a combination of both critical dimension tolerances and overlay specifications.

Obviously, the greater the magnitude of the factor N employed, the larger the size the trench structure will be, and thus the more likely any edge effects will be completely eliminated. However, as indicated above, there is a practical limit as to how much the trenches in the kerf test structure can be widened. In one respect, trenches that become too wide will result in a less faithful replication of the actual device circuitry and can thus reduce the value of the via measurement itself. In addition, where trenches are made at increasing widths, there is also the issue of the planarity of material formed therein, such as photoresist. Specifically, for dual damascene processes, large trench openings that are filled with resist during the via formation step are subject to non-uniform height across the width of the trench. Thus, the resist thickness for via imaging in the test structure can vary from the resist thickness in the device areas of the wafer, and so the test vias would in that case not be representative of those made in the actual process. Accordingly, when implementing a specific ground rule formula for CD SEM measurements, both edge effects and accurate device replication should be taken into consideration.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing edge effect interference with critical dimension (CD) measurement of semiconductor via structures, the method comprising:

forming a test structure in a kerf region of a semiconductor wafer, said test structure comprising at least a via structure and a trench structure in contact with said via structure;

said via structure being formed in accordance with a critical dimension associated with a corresponding via structure in a circuit region of the semiconductor wafer; and said trench structure in said kerf region being formed so as to have a greater width with respect to a width of a corresponding trench structure in a circuit region of the semiconductor wafer, wherein the width of the trench structure in the circuit region corresponds to a defined minimum ground rule dimension;

wherein said greater width of said trench structure of said test structure is a function of a defined, non-zero overlay tolerance with respect to said via structure and said trench structure determined in accordance with the expression:

$Mx$ trench width=$Mx$ minimum spacing+$N*Mx$ to prior level overlay specification;

wherein Mx trench width represents the x$^{th}$ level of metallization in the semiconductor wafer, Mx minimum spacing represents said defined minimum ground rule dimension associated with said corresponding trench structure in a circuit region of the semiconductor wafer, Mx to prior level overlay specification represents said overlay tolerance with respect to said via structure and said trench structure, and N represents a factor of said overlay tolerance.

2. The method of claim 1, wherein said greater width of said trench structure of said test structure is a function of a critical dimension tolerance with respect to said via structure and said trench structure.

3. The method of claim 1, wherein said greater width of said trench structure of said test structure is a function of an overlay tolerance and a critical dimension tolerance with respect to said via structure and said trench structure.

4. The method of claim l, wherein N is at least 2.

5. A test structure for reducing edge effect interference with critical dimension (CD) measurement of semiconductor via structures, comprising:

a trench structure and a via structure formed in a kerf region of a semiconductor wafer, said trench structure in contact with said via structure;

said via structure being formed in accordance with a critical dimension associated with a corresponding via structure in a circuit region of the semiconductor wafer; and said trench structure in said kerf region formed so as to have a greater width with respect to a width of a corresponding trench structure in a circuit region of the semiconductor wafer, wherein the width of the trench structure in the circuit region corresponds to a defined minimum ground rule dimension;

wherein said greater width of said trench structure of said test structure is a function of a defined, non-zero overlay tolerance with respect to said via structure and said trench structure determined in accordance with the expression:

$$Mx \text{ trench width} = Mx \text{ minimum spacing} + N*Mx \text{ to prior level overlay specification};$$

wherein Mx trench width represents the x$^{th}$ level of metallization in the semiconductor wafer, Mx minimum spacing represents said defined minimum ground rule dimension associated with said corresponding trench structure in a circuit region of the semiconductor wafer, Mx to prior level overlay specification represents said overlay tolerance with respect to said via structure and said trench structure, and N represents a factor of said overlay tolerance.

6. The test structure of claim 5, wherein said greater width of said trench structure of said test circuit is a function of a critical dimension tolerance with respect to said via structure and said trench structure.

7. The test structure of claim 5, wherein said greater width of said trench structure of said test circuit is a function of an overlay tolerance and a critical dimension tolerance with respect to said via structure and said trench structure.

8. The test structure of claim 5, wherein N is at least 2.

* * * * *

UNITED STATES PATENT AND TRADEMARK OFFICE
CERTIFICATE OF CORRECTION

PATENT NO. : 7,645,620 B2  Page 1 of 1
APPLICATION NO. : 11/163229
DATED : January 12, 2010
INVENTOR(S) : Martin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 565 days.

Signed and Sealed this

Sixteenth Day of November, 2010

David J. Kappos
*Director of the United States Patent and Trademark Office*